United States Patent
Ikeda et al.

(10) Patent No.: US 8,353,424 B2
(45) Date of Patent: Jan. 15, 2013

(54) COMPONENT FEEDER

(75) Inventors: Hiroshi Ikeda, Kasumigaura (JP);
Yoshinao Usui, Tatebayashi (JP);
Kazuyoshi Oyama, Ashikaga (JP);
Tsutomu Yanagida, Oizumi (JP); Isao Takahira, Hitachinaka (JP)

(73) Assignee: Hitachi High-Tech Instruments Co., Ltd., Saitama (JP)

( * ) Notice: Subject to any disclaimer, the term of this patent is extended or adjusted under 35 U.S.C. 154(b) by 151 days.

(21) Appl. No.: 12/685,687

(22) Filed: Jan. 12, 2010

(65) Prior Publication Data

US 2010/0186901 A1 Jul. 29, 2010

(30) Foreign Application Priority Data

Jan. 27, 2009 (JP) ................................. 2009-014877

(51) Int. Cl.
*B32B 38/10* (2006.01)

(52) U.S. Cl. ....... 221/25; 221/72; 414/411; 414/416.05; 225/23; 156/941

(58) Field of Classification Search .................. 156/714, 156/717, 762, 764, 930, 941; 221/25, 72, 221/73, 79, 87; 414/411, 416.01, 416.03, 414/416.05, 416.08, 425, 811; 225/10, 19, 225/23

See application file for complete search history.

(56) References Cited

U.S. PATENT DOCUMENTS

| | | | |
|---|---|---|---|
| 6,402,452 B1 | 6/2002 | Miller et al. | |
| 6,659,705 B1 * | 12/2003 | Reinnagel et al. | 414/412 |
| 2003/0219330 A1 * | 11/2003 | Lyndaker et al. | 414/411 |
| 2008/0093375 A1 * | 4/2008 | Davis et al. | 221/72 |

FOREIGN PATENT DOCUMENTS

| | | |
|---|---|---|
| JP | 04-022196 | 1/1992 |
| JP | 05-046098 | 6/1993 |
| JP | 10-139272 | 5/1998 |
| KR | 2006-0008520 | 1/2006 |

OTHER PUBLICATIONS

KR Office Action dated Jun. 9, 2011 with partial English translation.
KR Office Action dated Aug. 3, 2012 with partial English translation of ponderable parts.
Chinese Office Action dated Sep. 28, 2012; 6 pages.

* cited by examiner

*Primary Examiner* — Mark A Osele
(74) *Attorney, Agent, or Firm* — Antonelli, Terry, Stout & Kraus, LLP.

(57) ABSTRACT

A component feeder capable of enhancing productivity is provided by that the component feeder includes a tape feeding device intermittently feeding a component housing tape constituted of a carrier tape having component housing parts formed with predetermined interval to contain respective electronic components, and a cover tape covering the component housing parts to prevent the components from jumping out from the component housing parts while the component housing tape wound on a housing tape reel is sequentially fed to a component extracting position, and an electronic component exposing device exposing the electronic components in the component housing parts to be allowed to be extracted, wherein the tape feeding device is constituted of a first feeding device and a second feeding device, and the electronic component exposing device is provided between the first feeding device and the second feeding device.

4 Claims, 4 Drawing Sheets

COMPONENT FEEDER

BACKGROUND OF THE INVENTION

The present invention relates to a component feeder. The present invention relates to, for example, a component feeder including a tape feeding device which sequentially feeds a component housing tape constituted of a carrier tape on which component housing parts for housing electronic components are formed by being arranged at predetermined spaces, and a cover tape provided to cover the component housing parts formed on the carrier tape for preventing the components from jumping out of the component housing parts, in the state in which the component housing tape is wound on a housing tape reel, and intermittently feeds the component housing tape to a component extracting position, and an electronic component exposing device which exposes electronic components in the component housing parts to allow the electronic components to be taken out.

By using FIGS. 1 to 3, a component feeder as a comparative example of the present invention will be shown. FIG. 1 is a schematic view showing the component feeder as the comparative example of the present invention. FIG. 2 is a sectional view explaining an electronic component exposing device as the comparative example of the present invention. FIG. 3 is an explanatory view showing a component housing tape structure as the comparative example of the present invention.

As shown in FIG. 1, a component housing tape 1 wound on a housing tape reel 2 is conveyed in the directions of arrow A and arrow B by a feeding device 3 while being supported by a guide not illustrated. An electronic component exposing device 7 which is provided between the housing tape reel 2 and the feeding device 3 exposes electronic components by removing a cover tape 6 from a carrier tape which holds the electronic components in component housing parts. The electronic components which are exposed are held by a tip end portion of a component sucking and mounting device 9 by the component sucking and mounting device 9 vertically moving as arrow D. A device which allows the component sucking and mounting device 9 to hold an electronic component at the tip end portion may be vacuum pressure, a chuck mechanism and the like. The component sucking and mounting device 9 is a component extracting device which is provided at an electronic component mounting device which mounts an electronic component fed by the component feeder onto a substrate. The cover tape 6 which is removed is conveyed in the direction of arrow C by a cover tape feeding device 8 and is housed in a storage room or the like not illustrated. The cover tape feeding device 8 is formed into a reel shape such as a housing tape reel, for example, so that the reel may be rotated by a drive source to be wound up on the cover tape. The carrier tape from which the cover tape 6 is removed is conveyed to a cutter part 4 as arrow B and is cut by the operation of the cutter part (see, for example, JP-A-04-22196). In the component feeder of FIG. 1, conveyance of the component housing tape 1 is performed by balance of the conveying force by the feeding device 3 and the conveyance resisting force of the housing tape reel 2, the electronic component exposing device 7, the cover tape feeding device 8, the cutter part 4 and the like. Therefore, by setting the conveying force or the conveyance resisting force in the predetermined range, conveyance precision of the component housing tape 1 is kept.

By using FIG. 2, the electronic component exposing device will be described. FIG. 2 shows a sectional view of the electronic component exposing device 7. The component housing tape 1 is constituted of a carrier tape 10 and the cover tape 6. Further, the electronic component exposing device 7 is constituted of a cover tape removing part 12 which removes the cover tape 6 from the carrier tape 10, and a component extracting hole 11 for extracting an electronic component. The cover tape 6 is wound on so as to be along the shape of the cover tape removing part 12, so as to be moved to be removed from the carrier tape 10 when the carrier tape 10 moves.

By using FIG. 3, the component housing tape will be described. The component housing tape 1 is constituted of the carrier tape 10 and the cover tape 6. The carrier tape 10 is constituted of component housing parts 13 which house electronic components (not illustrated) and feeding holes which causes the conveying force for moving the component housing tape 1 to act on the carrier tape 10. The cover tape 6 is bonded to the carrier tape 10 at both sides of the component housing parts 13 in the direction orthogonal to the conveying direction, so that the electronic components sealed in the component housing part 13 do not jump out of the carrier tape 10.

In the component feeder of the comparative example of the present invention shown in FIG. 1, the component housing tape 1 has to be supplied when the component housing tape 1 of the housing tape reel 2 has run out. In order to supply the component housing tape 1, the vacant housing tape reel is removed, and replaced with a new housing tape reel 2, and the cover tape 6 removed from the carrier tape 10 has to be removed. The operation of removing the cover tape 6 has the problem of requiring much expense in time and effort. Further, the cover tape feeding device 8 for generating a removing force for removing the cover tape 6 is required, and therefore, there is the problem of increasing the size of the component feeder and complicating the component feeder.

As the means for solving these problems, JP-A-04-22196 provides the means which can make recovery of the cover tape 6 by the cover tape feeding device 8 unnecessary by providing removing means, which partially removes the cover tape 6 fitted to the surface of the component housing tape 1 from the central portion thereof to the directions of both sides, between the housing tape reel 2 and the feeding means 3. U.S. Pat. No. 6,402,452 provides the means for dividing the cover tape 6 by cutting the central portion of the cover tape 6, and provides the means which turns the divided cover tape 6. By providing the means which cuts and divides the cover tape 6, and the means which turns the divided cover tape 6, the electronic component can be exposed without removing the cover tape 6 from the carrier tape 10.

BRIEF SUMMARY OF THE INVENTION

However, in JP-A-04-22196, the cover tape removing means is provided between the feeding reel and the pitch feeding means, and therefore, if the winding diameter of the component housing tape wound on the housing tape reel changes when the component housing tape is conveyed, the conveyance resisting force received from the housing tape reel changes, which causes the possibility of worsening the conveyance precision with which the component housing tape is conveyed. Further, since the component housing tape is constituted so as to be conveyed by only the pitch feeding means, it is necessary to supply the component housing tape manually and expose the electronic components. Further, as the means which cuts the cover tape, a cutter is provided, and the blade of the cutter is constituted to face down, so as to cut the cover tape by the method of pressing the blade of the cutter against the top surface of the cover tape. When the cover tape is cut by the method for pressing the blade of the cutter against the cover tape, there are the possibility of damaging the electronic components covered with the cover tape by the blade of the cutter, and the possibility of being unable to cut the cover tape since the cover tape escapes in the direction in which the blade of the cutter is pressed.

In the examples described in JP-A-04-22196 and U.S. Pat. No. 6,402,452, as the means which partially removes the cover tape from the carrier tape, the tip end portion of the removing means is made a sharp edge so as to cut the central portion of the cover tape and turn the cover tape to both sides. The removing means with the tip end portion made a sharp edge cuts the cover tape from the undersurface thereof, and therefore, provides a force for pushing the cover tape upward. Therefore, when the force for pushing up the cover tape exceeds the bonding force of the cover tape and the carrier tape, there is the possibility of completely removing the cover tape from the carrier tape.

Thus, an object of the present invention is to provide a component feeder which moves electronic components to a sucking position with high precision by enhancing conveyance precision of a component housing tape, can accurately suck the electronic components, and can enhance productivity.

One aspect of the present invention is characterized in that in a component feeder including a tape feeding device which sequentially feeds a component housing tape constituted of a carrier tape in which component hosing parts for housing electronic components are formed side by side at predetermined spaces, and a cover tape, which is provided to cover the component housing parts formed in the carrier tape for preventing components from jumping out from the component housing parts, in the a state in which the component housing tape is wound on a housing tape reel, and intermittently feeds the component housing tape to a component extracting position, and an electronic component exposing device which exposes the electronic components in the component housing parts and allows the electronic components to be extracted, the tape feeding device is constituted of a first feeding device and a second feeding device, and an electronic component exposing device is provided between the first feeding device and the second feeding device.

Another aspect of the present invention is characterized in that the electronic component exposing device includes a cover tape cutting device which cuts and divides a cover tape, a cover tape opening device which opens the cover tape which is cut and divided to allow an electronic component to be extracted from a carrier tape, a tongue part which guides the cover tape into the cover tape cutting device, a cover tape presser device which arrests the cover tape so that the cover tape which is guided into the tongue part does not move vertically upward with respect to a cover tape top surface, and a component extracting hole for extracting the electronic component exposed by the cover tape opening device.

Another aspect of the present invention is characterized in that the cover tape cutting device is designed to give cutting force from an undersurface of the cover tape.

Still another aspect of the present invention is characterized in that the cover tape opening device includes a cover tape guiding device which guides the cover tape cut and divided by the cover tape cutting device.

According to one aspect of the present invention, the first feeding device and the second feeding device which convey the component housing tape are provided, and the electronic component exposing device is provided between the first feeding device and the second feeding device, whereby conveyance of the component housing tape can be made stable, and therefore, a component feeder which can enhance conveyance precision of the component housing tape, can move the electronic components to the component extracting position with high precision, can accurately extract the electronic components, and can enhance productivity can be provided.

Further, according to another aspect of the present invention, the cover tape processing mechanism which is the conveyance resisting force acting on the component housing tape is made unnecessary, whereby conveyance precision of the component housing tape can be enhanced and the device structure can be simplified. Further, according to another aspect of the present invention, the electronic components can be exposed without completely removing the cover tape from the carrier tape, and therefore, the cover tape and the carrier tape can be collectively recovered. Therefore, operability can be enhanced.

Other objects, features and advantages of the invention will become apparent from the following description of the embodiments of the invention taken in conjunction with the accompanying drawings.

DETAILED DESCRIPTION OF THE INVENTION

A component feeder using the present invention will be described hereinafter.
Embodiment 1

Figure 1:
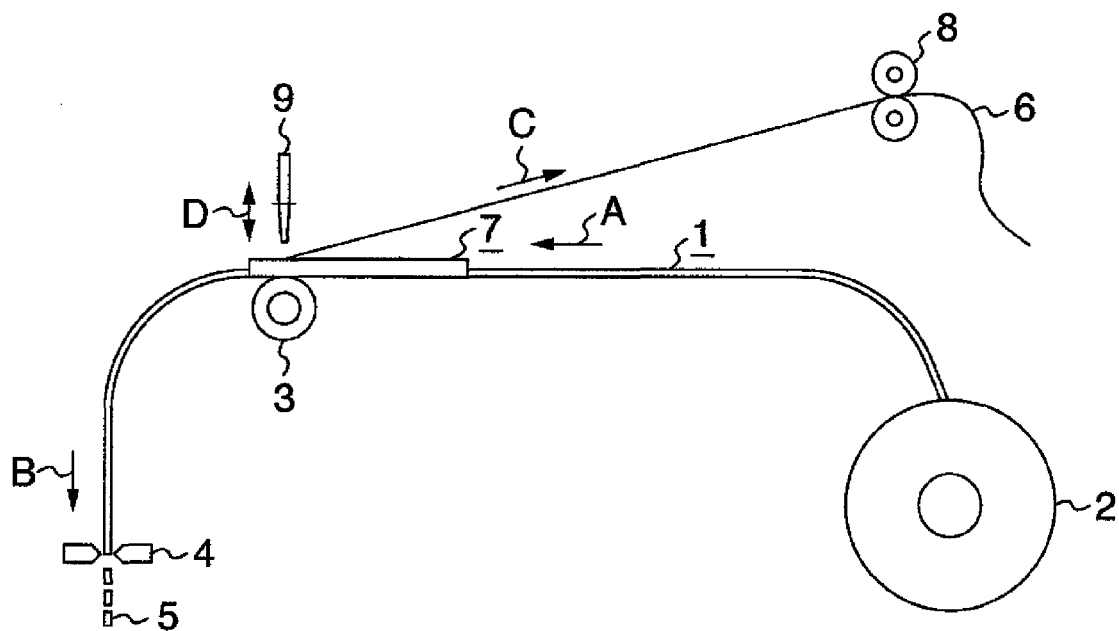
FIG. 1 is a schematic explanatory view explaining an electronic component feeder as a comparative example of the present invention.
Figure 2:
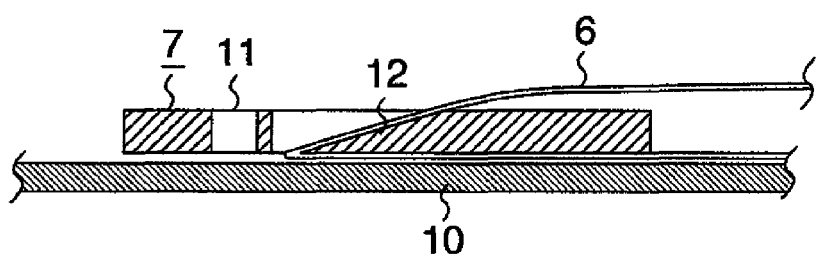
FIG. 2 is a schematic explanatory view explaining an electronic component exposing device as the comparative example of the present invention.
Figure 3:
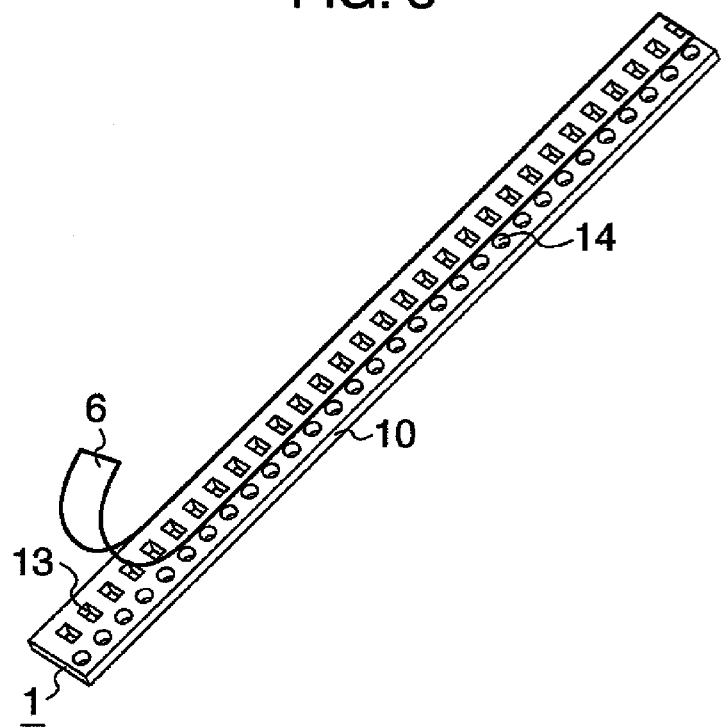
FIG. 3 is a perspective view explaining a structure of a carrier tape as the comparative example of the present invention.
Figure 4:
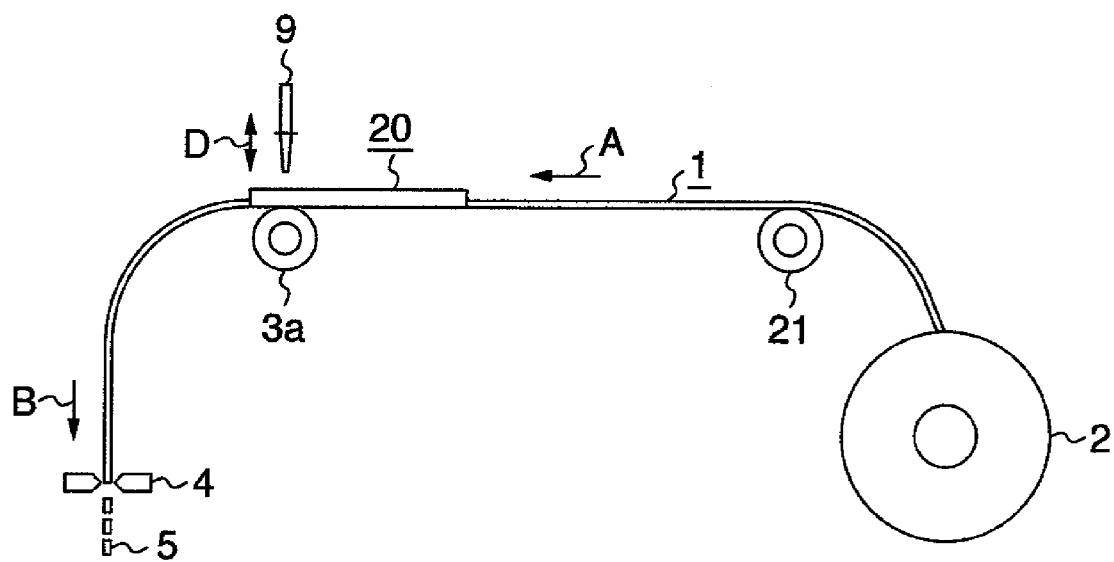
FIG. 4 is a schematic explanatory view explaining an electronic component feeder of an embodiment of the present invention.

A schematic constitution of a component feeder of embodiment 1 of the present invention will be described with use of FIG. 4. As shown in FIG. 4, a component housing tape 1 which is wound on a housing tape reel 2 is taken in the component feeder through an inlet port for taking in a component housing tape provided in a casing of the component feeder not illustrated, and is conveyed in the direction of arrow A by a second feeding device 21 while being supported by a guide not illustrated. The housing tape reel 2 may be held by and fixed to the inlet port to be replaceable, or may be held at the position apart from the component feeder. The second feeding device 21 may be the one in a gear shape having a projecting portion engaged with holes provided in the component housing tape 1, or may be the one formed by having a pair of rollers which pinch on the top surface and the undersurface of the component housing tape. An electronic component exposing device 20 which is provided between a first feeding device 3a and the second feeding device 21 exposes electronic components by partially peeling a cover tape 6 from a carrier tape which holds the electronic components in component housing parts. The first feeding device 3a may be, for example, the one in the gear shape having a projecting portion which engages with the holes provided in the component housing tape 1, or may be the one formed by having a pair of rollers which pinch at the top surface and the undersurface of the component housing tape. The exposed electronic component is held at a tip end portion of a component sucking and mounting device 9 by the component sucking and mounting device 9 vertically moving as arrow D. A device which allows the component sucking and mounting device 9 to hold an electronic component at the tip end portion may be vacuum pressure, a chuck mechanism and like. The cover tape 6 which is partially peeled is conveyed to a cutter part 4 with the carrier tape in the direction of arrow B by the first feeding device 3a and the second feeding device 21, and is cut by the operation of the cutter part. In the component feeder of FIG. 4, the component housing tape 1 is fed to the electronic component exposing device 20 by the second feeding device 21. In order to insert the component housing tape 1 into the electronic component exposing device 20 reliably without depending on the tape condition such as rigidity of the component housing tape 1, the distance between the first feeding device 3a and the second feeding device 21 may be made short, and if the distance between the housing tape reel 2 and the second feeding device 21 becomes long as a result of this, one or more third feeding devices may be additionally provided though not illustrated. Thereby, even when the component feeder and the component feeding system become large in size, the component housing tape can be conveyed with high precision.

Figure 5:
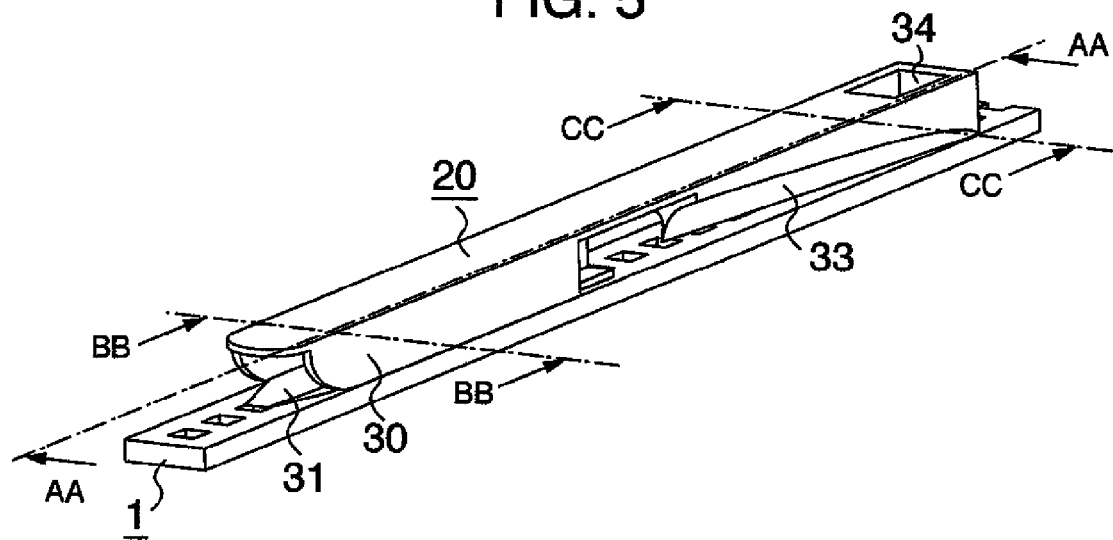
FIG. 5 is a perspective view explaining an electronic component exposing device of the embodiment of the present invention.

FIG. 5 shows a perspective view explaining the constitution of the electronic component exposing device 20. The electronic component exposing device 20 is disposed on the top surface side of the component housing tape 1 (the cover tape is not shown clearly). The electronic component exposing device 20 is constituted of a tongue portion 31 which is inserted between the undersurface of the cover tape 6 and the carrier tape 10 to guide the cover tape 6 to a cover tape cutting device, see 32 in FIG. 6, a cover tape presser device 30 which presses both end portions of the cover tape 6 which is guided to the cover tape cutting device by the tongue portion 31, a cover tape opening device 33 which opens the cover tape 6, which is cut and divided by the cover tape cutting device, to both sides to expose the electronic components, and a component extracting hole 34 for extracting the electronic components exposed by the cover tape opening device 33 from the component housing parts of the carrier tape 10.

Figure 6:
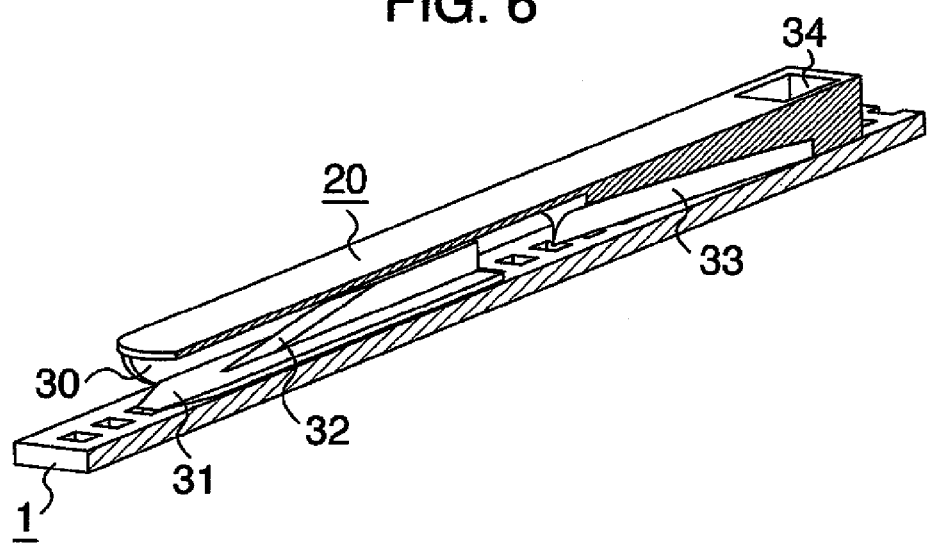
FIG. 6 is a sectional view explaining the electronic component exposing device of the embodiment of the present invention.

FIG. 6 shows an AA-AA section in FIG. 5 explaining the electronic component exposing device 20, and the cover tape cutting device 32 will be described. The cover tape cutting device 32 is provided to connect to the tongue portion 31 which guides the cover tape 6 to the cover tape cutting device 32. In order to cut and divide the cover tape 6 guided by the tongue portion 31, the blade portion of the cover tape cutting device 32 is set to face up so that the blade faces the undersurface side of the cover tape 6. Further, the blade of the cover tape cutting device 32 is of an inclined structure in order to reduce the resistance against conveyance of the component housing tape 1. Further, the blade portion of the cover tape cutting device 32 has such a constitution that it is not present on the undersurface of the tongue portion 31 so that the electronic components are present on the undersurface of the tongue portion 31 and do not contact the blade. Further, in order to keep the sharpness of the blade of the cover tape cutting device 32, the blade portion may be heated by a heating device not illustrated.

Figure 7:
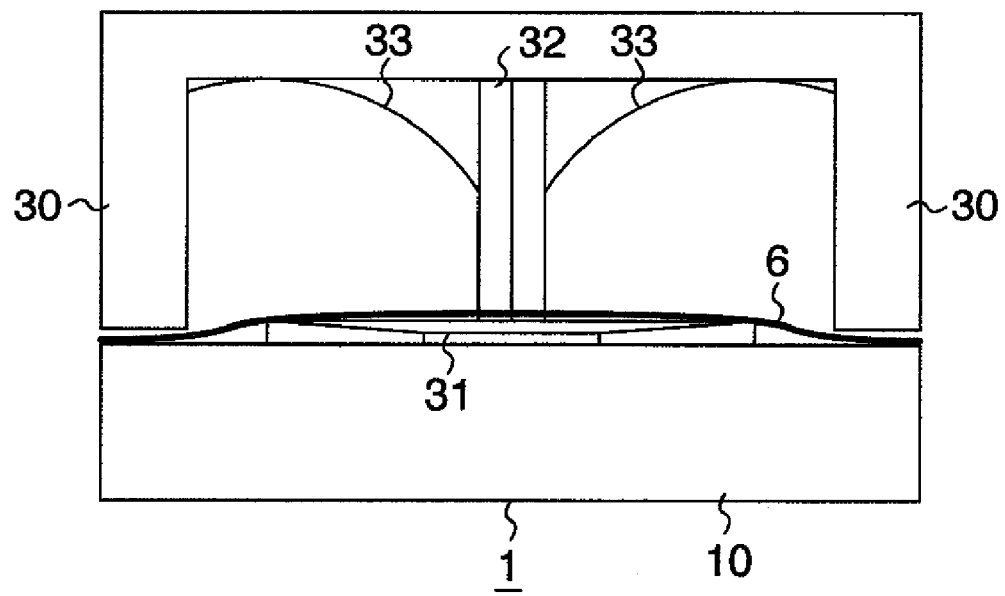
FIG. 7 is a sectional view explaining the electronic component exposing device of the embodiment of the present invention.

FIG. 7 shows a section taken along the line BB-BB in FIG. 5 explaining the electronic component exposing device 20, and the cover tape presser device 30 will be described. Since the blade has an inclined structure, the force for lifting the cover tape 6 upward occurs, and in order to prevent the cover tape 6 from rising and completely peeling from the carrier tape 10, the cover tape presser device 30 is provided. The undersurface of the cover tape presser device 30 is located equally to or under the top surface of the tongue portion 31, and restrains the cover tape 6 from moving upward.

Figure 8:
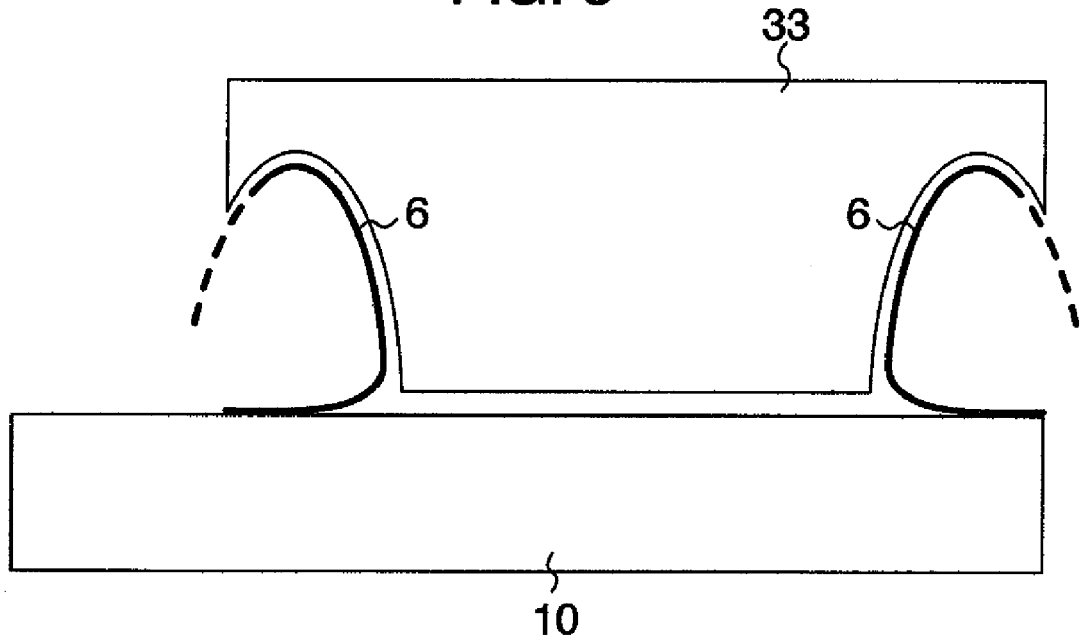
FIG. 8 is a sectional view explaining the electronic component exposing device of the embodiment of the present invention.

FIG. 8 shows a section taken along the line CC-CC in FIG. 5 explaining the electronic component exposing device 20, and the cover tape opening device 33 will be described. As shown in FIG. 5, the tip end side of the cover tape opening device 33 is formed to be narrow in width or formed into a sharp edge so as to be easily inserted in the cut portion of the cover tape 6 which is cut, so that the cover tape 6 easily enters. Further in order to reduce the resistance force against opening the divided cover tape 6, the cover tape opening device 33 is in the shape which gradually opens the cover tape 6. FIG. 8 shows the relation of the cover tape 6 in the state in which the cover tape 6 is opened and an electronic component is exposed and the cover tape opening device 33. As shown in FIG. 8, the cover tape opening device 33 guides the divided end portions of the cover tape 6 to deform the cover tape 6, and defines the shape so that the end portions do not advance upward or in the lateral direction.

As described above, the component feeder is constituted of the first feeding device and the second feeding device which convey the component housing tape 1, and the electronic component exposing device is further provided between the first feeding device and the second feeding device, whereby conveyance of the component housing tape 1 is stabilized, and conveyance precision can be enhanced.

Further, the electronic component exposing device includes the cover tape cutting device which cuts and divides the cover tape, the cover tape opening device which opens the cover tape which is cut and divided so that an electronic component can be extracted from the carrier tape, the tongue portion which guides the cover tape into the cover tape cutting device, the cover tape presser device which arrests the cover tape so that the cover tape guided into the tongue portion does not move vertically upward with respect to the cover tape top surface, and the component extracting hole for extracting the electronic component which is exposed by the cover tape opening device, whereby the cover tape feeding device 8 is made unnecessary, and thereby, the conveyance resistance of the component housing tape 1 due to the cover tape feeding device 8 can be eliminated, and the conveyance precision can be enhanced. Further, by making the cover tape feeding device 8 unnecessary, the structure of the component feeder can be simplified.

Further, the cover tape cutting device is designed so as to give the cutting force from the undersurface of the cover tape, and therefore, can expose the electronic components without damaging the electronic components.

Further, the cover tape opening device includes the cover tape guiding device which guides the cover tape cut and divided by the cover tape cutting device, and has the structure in which the end portion of the cover tape is not projected upward or in the lateral direction, but guided in a direction toward the outside, e.g. in a direction which bisects the feeding direction as shown in FIG. 8, and therefore, interference of the component sucking and mounting device 9 and the adjacent component feeder and the end portion of the cover tape 6 can be avoided.

Further, the following characteristics are included in addition to the above described ones. More specifically, at least the aforementioned component extracting hole is located between the aforementioned first feeding device and the aforementioned second feeding device.

Further, the inlet port for taking in the component housing tape having the carrier tape having the component housing parts housing electronic components, and the cover tape provided to cover the aforementioned component housing parts, the conveying device which conveys the aforementioned component housing tape to the component extracting position from the aforementioned inlet port, the electronic component exposing device which exposes the electronic component in the aforementioned component housing part, and the component extracting device which extracts the aforementioned electronic component are included, and the aforementioned conveying device has the first conveying device and the second conveying device which are disposed so that the aforementioned component extracting device is located therebetween.

Further, in addition to the aforementioned first conveying device and the aforementioned second conveying device, one or more of the third conveying device or third conveying devices is or are included.

Further, the aforementioned inlet port takes in the aforementioned component housing tape from the tape reel which holds the aforementioned component housing tape.

Further, the aforementioned component extracting device has the sucking device which extracts components by sucking.

Further, the aforementioned electronic component exposing device has the cover tape cutting device which cuts the aforementioned cover tape, and the cover tape opening device which exposes the aforementioned electronic component.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A component feeder comprising,
a tape feeding device for feeding intermittently a component housing tape to a component extracting position from a housing tape reel on which the component housing tape is wound, the component housing tape including a carrier tape on which component housing parts are lined up with predetermined interval to house therein respective electronic components, and a cover tape covering the component housing parts to prevent the electronic components from moving out from the component housing parts, and
an electronic component exposing device for exposing each of the electronic components to the outside of the component housing parts so that the electronic component is capable of being extracted from the component housing tape,
wherein the tape feeding device has first and second feeding devices each of which drives the component housing tape to be fed, and the electronic component exposing device is arranged to expose the electronic component on the component housing tape between the first and second feeding devices, and
wherein the electronic component exposing device has a cover tape cutting device for cutting the cover tape to be divided to portions thereof, a cover tape opening device for expanding a clearance between the portions so that the electronic component is capable of being extracted through the clearance, a tongue portion for guiding the cover tape to the cover tape cutting device, a cover tape presser device for restraining the cover tape guided by the tongue portion from being removed from the carrier tape, and a component extracting hole through which the electronic component is capable of being extracted from the component housing tape.

2. The component feeder according to claim 1, wherein the cover tape cutting device has a cutting edge terminating in a direction away from the carrier tape so that the cutting edge contacts a surface of the cover tape facing to the carrier tape.

3. The component feeder according to claim 1, wherein the cover tape opening device has a cover tape guiding device for guiding the portions of the cover tape.

4. The component feeder according to claim 1, wherein the component extracting hole is arranged to extract the electronic component from the component housing part between the first and second feeding devices.

\* \* \* \* \*